(12) United States Patent
Tang et al.

(10) Patent No.: US 11,139,145 B2
(45) Date of Patent: Oct. 5, 2021

(54) ION IMPLANTATION SYSTEM WITH MIXTURE OF ARC CHAMBER MATERIALS

(71) Applicant: ENTEGRIS, INC., Billerica, MA (US)

(72) Inventors: Ying Tang, Brookfield, CT (US); Sharad N. Yedave, Danbury, CT (US); Joseph R. Despres, Middletown, CT (US); Joseph D. Sweeney, New Milford, CT (US); Oleg Byl, Southbury, CT (US)

(73) Assignee: Entegris, Inc., Billerica, MA (US)

( * ) Notice: Subject to any disclaimer, the term of this patent is extended or adjusted under 35 U.S.C. 154(b) by 0 days.

(21) Appl. No.: 16/904,286

(22) Filed: Jun. 17, 2020

(65) Prior Publication Data

US 2021/0020402 A1    Jan. 21, 2021

Related U.S. Application Data

(60) Provisional application No. 62/875,869, filed on Jul. 18, 2019.

(51) Int. Cl.
*H01J 37/317* (2006.01)
*H01J 37/08* (2006.01)

(52) U.S. Cl.
CPC .......... *H01J 37/3171* (2013.01); *H01J 37/08* (2013.01)

(58) Field of Classification Search
CPC .............................. H01J 37/3171; H01J 37/08
See application file for complete search history.

(56) References Cited

U.S. PATENT DOCUMENTS

| | | |
|---|---|---|
| 2003/0122089 A1 | 7/2003 | Murrell |
| 2009/0242793 A1 | 10/2009 | Low |
| 2011/0159671 A1 | 6/2011 | Kaim |
| 2013/0260544 A1 | 10/2013 | Koo |
| 2014/0062286 A1 | 3/2014 | Sato |

FOREIGN PATENT DOCUMENTS

| | | |
|---|---|---|
| EP | 3062330 A2 | 8/2016 |
| TW | 579882 B | 4/2017 |

*Primary Examiner* — Nicole M Ippolito
*Assistant Examiner* — Hanway Chang

(57) ABSTRACT

A system and method for ion implantation is described, which includes a gas or gas mixture including at least one ionizable gas used to generate ionic species and an arc chamber that includes two or more different arc chamber materials. Using the system ionic species are generated in the arc chamber with liner combination, and one or more desired ionic species display a higher beam current among the ionic species generated, which is facilitated by use of the different materials. In turn improved implantation of the desired ionic species into a substrate can be achieved. Further, the system can minimize formation of metal deposits during system operation, thereby extending source life and promoting improved system performance.

20 Claims, 9 Drawing Sheets

ION IMPLANTATION SYSTEM WITH MIXTURE OF ARC CHAMBER MATERIALS

CROSS-REFERENCE TO RELATED APPLICATION

This application claims priority to and the benefit of U.S. Provisional Application No. 62/875,869 filed Jul. 18, 2019 and which is incorporated by reference herein.

FIELD

The present disclosure relates to an ion implantation system having an arc chamber that uses a mixture of two or more different materials, and methods for ion implantation using the system.

BACKGROUND

Ion implantation involves deposition of a chemical species into a substrate, such as a microelectronic device wafer, by impingement of energetic ions of such species on the substrate. In order to generate the ionic implantation species, the gas, which may for example comprise a halide or hydride species, is subjected to ionization. This ionization is carried out using an ion source to generate an ion beam. The ion source is typically a gas or gas mixture.

Once generated at the ion source, the ion beam is processed by extraction, magnetic filtering, acceleration/deceleration, analyzer magnet processing, collimation, scanning and magnetic correction to produce the final ion beam that is impinged on the substrate.

Upon ionization, an ionizable gas typically generates multiple ionic species. Each ionic species derived from a starting compound (e.g., gas) has a different atomic composition than another ionic species, and there may be a desire to implant certain species, a desire to avoid implanting certain species, or both, based on these atomic composition and desired modification of the substrate. However, upon ionization and under conditions used to generate the ion beam for implantation, each ionic species have a beam current which can affect implantation of species into the substrate.

Ion implantation processes can also become increasingly complex when additional ionic species are generated in the arc chamber by the reaction of gas species with chamber material, such as the reaction of fluoride ions with tungsten arc chamber to generate tungsten fluorides.

Various challenges remain for improving ion beam performance particularly as ion implantation processes become more complex.

SUMMARY

This disclosure relates to systems and methods for implanting ionic species into a substrate in an ion implantation process. In many aspects, the disclosure provides ways to alter or improve performance of the ionic species generated from a gas or gas mixture by selecting and using mixtures of different arc chamber materials together with a one or more ionizable gases. The system includes an arc chamber with two or more different arc chamber materials. The presence of the second, different, arc chamber material that is different than the first arc chamber material facilitates increased beam current performance for one or more desired ionic species upon ionization of the ionizable gas. This allows improved implantation of the one or more desired ionic species into the substrate using its higher beam current. It can also minimize deposition of ionic species that are not desirably introduced in the substrate, as those species will have lower beam currents The mixture of different materials used for construction of portions of the arc chamber can also minimize formation of unwanted arc chamber deposits that otherwise form during system operation, such as resulting from reaction of gases (e.g., fluoride gasses) with chamber materials (e.g., tungsten). As such, unwanted deposits caused by reaction of arc chamber material can be minimized thereby extending source life and promoting improved system performance.

In one aspect, the disclosure provides a system for implanting an ionic species into a substrate, with the system including a gas source comprising a gas or gas mixture capable of forming at least one ionic species when ionized. The system includes an arc chamber comprising two or more different arc chamber materials wherein a first arc chamber material is different than a second chamber material. The arc chamber includes arc chamber walls having interior-plasma facing surfaces, and optionally one or more arc chamber liners configured to contact all or a portion of the interior-plasma facing surfaces.

In some aspects, the two of more different arc chamber materials include first and second arc chamber materials having one or more atoms including but not limited to tungsten, molybdenum, carbon, silicon, boron, magnesium, calcium, aluminum, fluorine, indium, nitrogen, oxygen, gallium, germanium, and lanthanum. The first and second arc chamber materials can include individual compounds, intermetallics, alloys, composites, solid solution (an alloy formed by a matrix "solvent" metal with another "solute" element atomically dispersed in its crystal structure with solute to solvent ration being continuous over a small range), and mixtures of solid materials. In some embodiments, the first or second arc chamber materials can include a graphite-containing material, a carbon-containing material, a boron-containing, a germanium-containing, an antimony-containing, a tungsten-containing, a molybdenum-containing a fluorine-containing, a nitrogen-containing, an oxygen-containing material, a ceramic material, or an alloy. For example, the first or second arc chamber material can include graphite (C), boron (B), germanium (Ge), boron nitride (BN), (boron oxide) $B_2O_3$, (germanium oxide) $GeO_2$, silicon carbide (Sick), tungsten carbide (WC, $W_2C$), tungsten boride (WB, $W_2B$, $WB_2$, $WB_4$), boron carbide ($B_4C$, $B_{12}C_3$), tungsten germanium $W_2Ge_3$, calcium carbide ($CaC_2$), $Al_4C_3$, (magnesium carbide) $Mg_2C$, (aluminum fluoride) $AlF_3$, (gallium fluoride) $GaF_3$, (indium fluoride) $InF_3$, (gallium nitride) GaN, aluminum nitride (AlN), (indium nitride) InN, tungsten lanthanum oxide ($WLa_2O_3$), gallium oxide ($Ga_2O_3$), (indium oxide) $In_2O_3$, antimony oxide ($Sb_2O_3$), or aluminum oxide ($Al_2O_3$). The first or second arc chamber material can also include a tungsten alloy. An exemplary tungsten-based alloy is $WB_{2-x}$, x=0.001-0.5.

In one exemplary embodiment, a first arc chamber material is tungsten and a second arc chamber material includes carbon in the form of graphite or a carbide compound.

In another exemplary embodiment, a first arc chamber material is tungsten and a second arc chamber material include a boron-containing material in the form of elemental boron, a boride compound or a boron-containing alloy.

Yet, in another exemplary embodiment, a first arc chamber material or a second arc chamber material is selected from isotopically enriched materials in one or more isotopes relative to their natural abundance. In one exemplary embodiment, a first or second arc chamber material is a boron-containing material with isotopically enriched boron in B-11 isotope. In another exemplary embodiment, a first or second arc chamber material is a germanium-containing material enriched in one or more germanium isotopes such as Ge-72 isotope.

These different arc chamber materials can be present in the arc chamber in various arrangements. The first or second arc chamber materials can be present in all or a portion of one or more of arc chamber liner(s) or arc chamber piece(s). In one type of arrangement, the second arc chamber material is coated onto or surface graded into, a portion of or all of the arc chamber walls with the arc chamber walls being made of the first arc chamber material. In another arrangement, the arc chamber has one or more arc chamber liners, with the one or more arc chamber liners including at least one of the first or second arc chamber materials. In still yet another embodiment, the first or second arc chamber material may be provided as separate piece or target that is disposed in the arc chamber.

In another aspect, the disclosure provides a method for implanting one or more ion species into a substrate. The method includes providing a system as described herein having a gas source comprising a gas or gas mixture capable of generating at least one ion species when ionized, an arc chamber having at least first and second arc chamber materials that are different. In the method a substrate is present in an implantation chamber and the system is operated to implant the one or more ion species into the substrate. Exemplary ionizable gases include, but are not limited to silicon containing gases, boron containing gases, germanium containing gases, carbon containing gases, phosphorus containing gases, arsenic containing gases, antimony containing gases, tungsten containing gases, nitrogen containing gases, gallium containing gases, indium containing gases, tin containing gases, and aluminum containing gases. The ionizable gas can be co-flowed or provided in mixture with at least one other gas. The at least one other gas can include a co-gas which contains the same species as the ionizable gas, and/or a diluent or carrier gas.

In the method, a gas or gas mixture capable of generating ionic species can be flowed into the arc chamber at a predetermined flow rate. Upon application of a predetermined power and voltage in the arc chamber, ionic species can be generated from the gas or gas mixture, with the species including one or more desired ionic species for substrate implantation. Using desired operating conditions of the system, the beam current ionic species is increased to a greater extent than any of the other ionic species due to the presence of the second arc chamber material, relative to the beam currents of the ionic species generated without the second arc chamber material under the same operating conditions. Using this method, the ionic species with the greatest beam current can be selected for implantation into the substrate.

In an exemplary mode of practice, the ionizable gas or gas mixture is flowed into the arc chamber at a predetermined flow rate. Exemplary gases can include CO, $CO_2$, $CF_4$, $CH_4$, $C_xH_yF_z$, $BF_3$, $B_2F_4$, $B_2H_6$, $PH_3$, $PF_3$, $PF_5$, $AsH_3$, $AsF_3$, $AsF_5$, $GeF_4$, $GeH_4$, $Ge_2H_6$, $SiF_4$, $Si_2F_6$, $SiH_5$, $S_{12}H_6$, $Si_3H_8$, $SbH_3$, $SbF_5$. In some embodiments, the gas or gas mixture can include an isotopically enriched gas such as, for example, isotopically enriched $BF_3$ gas or isotopically enriched $GeF_4$ gas, but not limited to these. In some embodiment, the ionizable gas is a boron containing gas mixture including $BF_3$ and at least one additional gas. The at least one additional gas can include a co-species gas (e.g. $B_2F_4$, $B_2H_6$) and/or a diluent gas (e.g. $H_2$, Xe, Xe/$H_2$, Na, Kr, Ar, He). Specific examples of gas mixtures can include: $BF_3/H_2$; $BF_3/B_2F_4$; $BF_3/B_2F_4/H_2$; $BF_3/B_2H_6$; $BF_3/B_2H_6/H_2$; $BF_3/Xe+H_2$; and $BF_3/B_2H_6/Xe+H_2$, but not limited to these. The $BF_3$ gas can be enriched $BF_3$ gas.

Upon application of a predetermined power and voltage in the arc chamber, one or more ions and one or more ionic species ionic species can be generated from the ionizable gas or gas mixture. Exemplary ionic species include ions such as a $C^+$ ion, a $B^+$ ion, a $N^+$ ion, a $F^+$ ion, a $Si^+$ ion, an $Ge^+$ ion, a $P^+$ ion, an $As^+$ ion, a $Ga^+$ ion, a $Sb^+$ ion, a $In^+$ ion, a $Al^+$ ion, a $Sn^+$, etc. Multi-atom ionic species can also be generated such as $CF_3+$, $CF_2+$, $CF+$, $BF+$, $BF_2^+$, $SiF_3^+$, $Si_2+$, $SiF+$, $GeF_3+$, $GeF_{2+}$.

In the arc chamber having two different arc chamber liner materials, the ionic species each have beam currents generated using the desired operating conditions, with a desired ionic species having an optimized beam current, as measured against the ionic species beam currents generated using the same optimal operating conditions but without the second arc chamber material. That is, the desired ionic species displays a significant increase in beam current using the mixture of different arc chamber materials as compared to an arc chamber being composed of only one material, where other, non-desired ionic species (e.g., those having non-metal ions or metalloid ions), either do not display any significant increase in current, have the same current, or have a reduced beam current using the liner mixture as compared to the single liner. In turn, the higher beam current for the desired ionic species facilitates its improved implantation into the substrate, while the implantation of other non-desired ionic species can be minimized.

DETAILED DESCRIPTION

Figure 1:
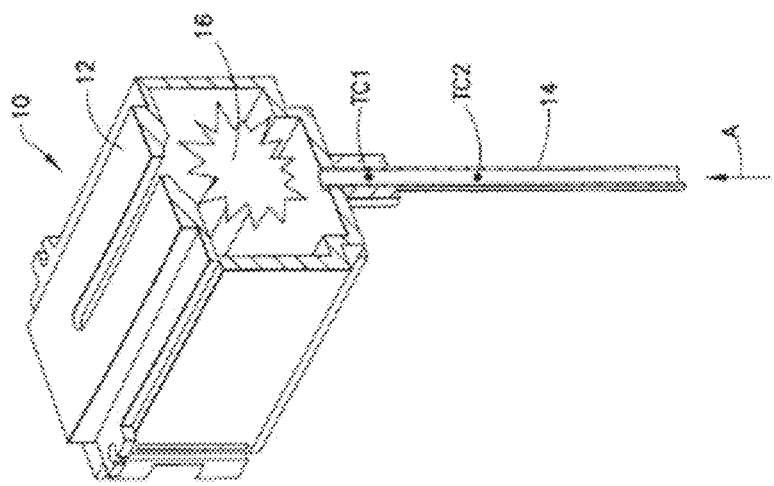
FIG. 1 is a schematic representation of an ion implantation system, including an arc chamber with a gas feed line for feeding dopant source gas to the arc chamber for ionization thereof in the chamber.

Embodiments of the disclosure relate to systems and methods for ion implantation, wherein the system includes an arc chamber used for ion implantation and having at least two different arc chamber materials. Any type of ion implantation system can be used for the ion implantation methods as described herein. The arc chamber has arc chamber walls with interior-plasma facing surfaces. Optionally there are one or more arc chamber liners configured to contact all or a portion of the interior-plasma facing surfaces of the walls of the arc chamber. In the arc chamber the two or more different arc chamber materials are present in the arc chamber walls, in one or more optional arc chamber liners, or both. The system also includes a gas source that provides a gas or gas mixture capable of forming at least one ion species when ionized. Further, the system can include an implantation chamber in which the one or more ionic species, which generated in the arc chamber, can be implanted into a substrate.

The system with two different arc chamber materials can be used for providing improved ion implantation, and in various aspects used for methods in which an ion-generating gas or gas mixture generates a plurality of ionic species. The system can be operated with a predetermined flow rate of the ion-generating gas or gas mixture, a predetermined arc power, and predetermined source magnetic field. The operating conditions can provide an optimized beam current for a desired ion species among the plurality of ionic species, which in turn can be targeted for implantation into a substrate.

In some arrangements, the arc chamber has walls with interior-plasma facing surfaces (i.e., those surfaces of the arc chamber that contact plasma when the system is in use). The interior facing surfaces can be presented by a first sidewall, a second sidewall, a cathode sidewall, an anti-cathode sidewall, a bottom, and a top of the arc chamber. All or a portion of the interior-plasma facing surfaces of the first sidewall, second sidewall, cathode sidewall, anti-cathode sidewall, bottom, and/or top can include the second, different, arc chamber material in the form of a coating, surface grading, or arc chamber liner. The interior-plasma facing surfaces of the arc chamber can present a total interior-plasma facing surface area, and the amount of arc chamber materials can be defined in terms of a percent amount of materials of the total interior-plasma facing surface area. For example, the system can include at least a portion of the arc chamber liner formed of the second arc chamber material, wherein the arc chamber liner covers a certain percentage of the total interior-plasma facing surface area of the chamber. As another example, the system can include at least a portion of one or more of the interior-plasma facing surfaces of the one arc chamber walls surface graded or coated with the second arc chamber material, with a desired percentage of the total interior-plasma facing surface area coated or surface graded with the second arc chamber material.

The arc chamber includes two of more different arc chamber materials. These different arc chamber materials can be present in the arc chamber in various arrangements. The first or second arc chamber materials can be present in all or a portion of one or more of arc chamber liner(s) or arc chamber piece(s). In one embodiment, the second arc chamber material is coated onto or surface graded into, a portion of or all of the arc chamber walls with the arc chamber walls being made of the first arc chamber material. In another embodiment, the arc chamber has one or more arc chamber liners, with the one or more arc chamber liners including the second arc chamber material. A liner may be a flat, e.g., planar piece of structure having two opposed major surfaces and a thickness therebetween. A liner may be rectangular, curved (e.g., rounded), angular, or otherwise shaped. A liner can be removable, meaning that the liner can be inserted and removed from the interior space of the ion source chamber. In other cases, a liner can be permanent and non-removable from the chamber. In still other embodiments, the first or second arc chamber material can be provided as a separate piece or target that is mounted in the arc chamber or received in a recess formed in the liner or the arc chamber walls for this purpose. The separate piece may be of any suitable shape or size such that it can be disposed in the arc chamber. In one embodiment, the separate piece includes the second arc chamber material and the arc chamber walls and/or liner includes the first arc chamber material, the first and second arc chamber materials being different from one another. In embodiments, the separate piece is a consumable structure and reacts with the ionizable gas or gas mixture. In one example, the separate piece is a sputtering target.

In exemplary embodiments, one of the at least two different first and second arc chamber materials can be any one or more of the following materials: graphite (C), boron (B), germanium (Ge), boron nitride (BN), boron oxide ($B_2O_3$), germanium oxide ($GeO_2$), silicon carbide (SiC), tungsten carbide (WC, $W_2C$), tungsten boride (WB, $W_2B$, $WB_2$, $WB_4$), boron carbide ($B_4C$, $B_{12}C_3$), tungsten germanium ($W_2Ge_3$), calcium carbide ($CaC_2$), aluminum carbide ($Al_4C_3$), magnesium carbide ($Mg_2C$), aluminum fluoride ($AlF_3$), gallium fluoride ($GaF_3$), indium fluoride ($InF_3$), boron nitride (BN), gallium nitride (GaN), aluminum nitride (AlN), indium nitride (InN), tungsten lanthanum oxide ($WLa_2O_3$), gallium oxide ($Ga_2O_3$), indium oxide ($In_2O_3$), antimony oxide ($Sb_2O_3$) or aluminum oxide ($Al_2O_3$). In some cases the arc chamber includes three or more different arc chamber materials with at least two arc chamber materials, which are different, selected from graphite (C), boron (B), germanium (Ge), boron nitride (BN), boron oxide ($B_2O_3$), germanium oxide ($GeO_2$), silicon carbide (SiC), tungsten carbide (WC, $W_2C$), tungsten boride (WB, $W_2B$, $WB_2$, $WB_4$), boron carbide ($B_4C$, $B_{12}C_3$), tungsten germanium ($W_2Ge_3$), calcium carbide ($CaC_2$), aluminum carbide ($Al_4C_3$), magnesium carbide ($Mg_2C$), aluminum fluoride ($AlF_3$), gallium fluoride($GaF_3$), indium fluoride ($InF_3$), boron nitride (BN), gallium nitride (GaN), aluminum nitride (AlN), indium nitride (InN), tungsten lanthanum oxide ($WLa_2O_3$), gallium oxide ($Ga_2O_3$), indium oxide ($In_2O_3$), antimony oxide ($Sb_2O_3$) or aluminum oxide ($Al_2O_3$). In some cases the arc chamber includes four or more different arc chamber materials with at least three arc chamber materials, which are different, selected from graphite (C), boron (B), germanium (Ge), boron nitride (BN), boron oxide ($B_2O_3$), germanium oxide ($GeO_2$), silicon carbide (SiC), tungsten carbide (WC, $W_2C$), tungsten boride (WB, $W_2B$, $WB_2$, $WB_4$), boron carbide ($B_4C$, $B_{12}C_3$), tungsten germanium ($W_2Ge_3$), calcium carbide ($CaC_2$), aluminum carbide ($Al_4C_3$), magnesium carbide ($Mg_2C$), aluminum fluoride ($AlF_3$), gallium fluoride($GaF_3$), indium fluoride ($InF_3$), boron nitride (BN), gallium nitride (GaN), aluminum nitride (AlN), indium nitride (InN), tungsten lanthanum oxide ($WLa_2O_3$), gallium oxide ($Ga_2O_3$), indium oxide ($In_2O_3$), antimony oxide ($Sb_2O_3$) or aluminum oxide ($Al_2O_3$. In some cases the arc chamber includes five or more different arc chamber materials with at least four arc chamber materials, which are different, selected from graphite (C), boron (B), germanium (Ge), boron nitride (BN), boron oxide ($B_2O_3$), germanium oxide ($GeO_2$), silicon carbide (SiC), tungsten carbide (WC, $W_2C$), tungsten boride (WB, $W_2B$, $WB_2$, $WB_4$), boron carbide ($B_4C$, $B_{12}C_3$), tungsten germanium ($W_2Ge_3$), calcium carbide ($CaC_2$), aluminum carbide ($Al_4C_3$), magnesium carbide ($Mg_2C$), aluminum fluoride ($AlF_3$), gallium fluoride($GaF_3$), indium fluoride ($InF_3$), boron nitride (BN), gallium nitride (GaN), aluminum nitride (AlN), indium nitride (InN), tungsten lanthanum oxide ($WLa_2O_3$), gallium oxide ($Ga_2O_3$), indium oxide ($In_2O_3$), antimony oxide ($Sb_2O_3$) or aluminum oxide ($Al_2O_3$).

In some embodiments, at least one of the first, second, third, fourth, etc., arc chamber material can be a selected from isotopically enriched materials in one or more isotopes relative to their natural abundance. In one exemplary embodiment, a first or second arc chamber material is a boron-containing material with isotopically enriched boron in B-11 isotope. In another exemplary embodiment, a first or second arc chamber material is a germanium-containing material enriched in one or more germanium isotopes such as Ge-72 isotope.

The resulting mixture of two or more different arc chamber materials can improve the ion implant performance, including beam current and source life for a gas or gas mixture including one or more ions for ion implantation. In some embodiments, the presence of the two or more different arc chamber materials can reduce the amount of tungsten fluoride formed during an implantation process.

In some arrangements, the system of the disclosure can include two or more arc chamber liners with a first arc chamber liner made from tungsten, or tungsten and a combination of one or more materials, and a second arc chamber liner made from a material or combination of materials different than the first arc chamber liner. The arc chamber liner can be a flat, e.g., planar piece of structure having two opposed major surfaces and a thickness therebetween. A liner may be rectangular, curved (e.g., rounded, U-shaped), angular, or otherwise shaped. A liner can be removable, meaning that the liner can be inserted and removed from the interior space of the ion source chamber. In other cases, a liner can be permanent and non-removable from the chamber. In embodiments, the arc chamber includes two or more insertable liners, with one of the insertable liners formed from tungsten, and the arc chamber liner formed from a material such as graphite (C), boron (B), germanium (Ge), boron nitride (BN), boron oxide ($B_2O_3$), germanium oxide ($GeO_2$), silicon carbide (SiC), tungsten carbide (WC, $W_2C$), tungsten boride (WB, $W_2B$, $WB_2$, $WB_4$), boron carbide ($B_4C$, $B_{12}C_3$), tungsten germanium ($W_2Ge_3$), calcium carbide ($CaC_2$), aluminum carbide ($Al_4C_3$), magnesium carbide ($Mg_2C$), aluminum fluoride ($AlF_3$), gallium fluoride($GaF_3$), indium fluoride ($InF_3$), boron nitride (BN), gallium nitride (GaN), aluminum nitride (AlN), indium nitride (InN), tungsten lanthanum oxide ($WLa_2O_3$), gallium oxide ($Ga_2O_3$), indium oxide ($In_2O_3$), antimony oxide ($Sb_2O_3$) or aluminum oxide ($Al_2O_3$).

In some embodiments, the system includes a first arc chamber liner that is made from a tungsten-containing material, and a second arc chamber liner that is made from a non-tungsten-containing material such as one that is made of graphite, carbide, or a ceramic, as described herein. In other embodiments, the system includes a first arc chamber liner that is made from a tungsten-containing material, and a second arc chamber liner that is made of a mixture of tungsten-containing material and a non-tungsten-containing material. For example, the second arc chamber liner can be formed from a tungsten-containing material but that is surface graded or coated with graphite, carbide, or ceramic.

In examples, the second liner of the ion implantation system can comprise, consist of, or consist essentially of graphite (C), boron (B), germanium (Ge), boron nitride (BN), boron oxide ($B_2O_3$), germanium oxide ($GeO_2$), silicon carbide (SiC), tungsten carbide (WC, $W_2C$), tungsten boride (WB, $W_2B$, $WB_2$, $WB_4$), boron carbide ($B_4C$, $B_{12}C_3$), tungsten germanium ($W_2Ge_3$), calcium carbide ($CaC_2$), aluminum carbide ($Al_4C_3$), magnesium carbide ($Mg_2C$), aluminum fluoride ($AlF_3$), gallium fluoride ($GaF_3$), indium fluoride ($InF_3$), boron nitride (BN), gallium nitride (GaN), aluminum nitride (AlN), indium nitride (InN), tungsten lanthanum oxide ($WLa_2O_3$), gallium oxide ($Ga_2O_3$), indium oxide ($In_2O_3$), antimony oxide ($Sb_2O_3$) or aluminum oxide ($Al_2O_3$), or a combination thereof. An example consumable structure can comprise at least 50, 60, 70, 80, 90, or 95 percent by weight graphite (C), silicon carbide (SiC), elemental boron (B), boron carbide ($B_4C$, $B_{12}C_3$), aluminum carbide ($Al_4C_3$), magnesium carbide ($Mg_2C$). According to the present description, a material or structure that is said to "consist essentially of" a listed material or combination of materials, is a material or structure that contains the listed material or combination of materials and not more than an insubstantial amount of any other ingredients or materials; accordingly, a structure that consists essentially of graphite (C), elemental boron (B), silicon carbide (SiC), or a combination thereof, contains at least 97, 99, or 99.5 weight percent graphite (C), elemental boron (B), silicon carbide (SiC), or a combination thereof, and not more than 3, 1, or 0.5 weight percent of any other materials.

In some embodiments, the arc chamber includes two or more a, including a first liner made from tungsten carbide (WC, $W_2C$) and a second liner made from silicon carbide (SiC). In some embodiments, the arc chamber includes a first liner made from tungsten carbide (WC, $W_2C$) and a second liner made from graphite (C). In some embodiments, the arc chamber includes a first liner made from tungsten carbide (WC, $W_2C$) and a second liner made from boron carbide ($B_4C$, $B_{12}C_3$). In some embodiments, the arc chamber includes a first liner made from tungsten carbide (WC, $W_2C$) and a second liner made from calcium carbide ($CaC_2$). In some embodiments, the arc chamber includes a first liner made from tungsten carbide (WC, $W_2C$) and a second liner made from aluminum carbide ($Al_4C_3$). In some embodiments, the arc chamber includes a first liner made from tungsten carbide (WC, $W_2C$) and a second liner made from magnesium carbide ($Mg_2C$).

In some modes of fabrication, one or more non-tungsten materials are integrated into the structural material of an arc chamber wall or an arc chamber liner. For example, an arc chamber wall or arc chamber liner can be "surface graded" (e.g., "infused") with any one or more of the materials described herein, such as graphite (C), boron (B), germanium (Ge), boron nitride (BN), boron oxide ($B_2O_3$), germanium oxide ($GeO_2$), silicon carbide (SiC), tungsten carbide (WC, $W_2C$), tungsten boride (WB, $W_2B$, $WB_2$, $WB_4$), boron carbide ($B_4C$, $B_{12}C_3$), tungsten germanium ($W_2Ge_3$), calcium carbide ($CaC_2$), aluminum carbide ($Al_4C_3$), magnesium carbide ($Mg_2C$), aluminum fluoride ($AlF_3$), gallium fluoride($GaF_3$), indium fluoride ($InF_3$), boron nitride (BN), gallium nitride (GaN), aluminum nitride (AlN), indium nitride (InN), tungsten lanthanum oxide ($WLa_2O_3$), gallium oxide ($Ga_2O_3$), indium oxide ($In_2O_3$), antimony oxide ($Sb_2O_3$) or aluminum oxide ($Al_2O_3$), including any of the particular forms described herein. Surface grading can be accomplished by applying a desired non-tungsten material (graphite, carbide, etc.) to the metal surface of an arc chamber wall or liner and then heating the surface to integrate the non-tungsten material into the metal of the arc chamber wall or liner. The non-tungsten material becomes present at high density at the surface of the structure and can provide a protective barrier. Surface grading can be over all or a portion of the surface (interior) of the arc chamber wall or arc chamber liner.

In some embodiments the arc chamber wall or arc chamber liner is fully or partially modified or made from a graphite-containing material, a carbide-containing material, or a ceramic, that is in particulate form. Exemplary forms of these materials can be PLS (10 micron graphite), DFP (5 micron graphite), DFP3-2 (densified graphite), SCF (hard graphite), SCF-PYC (hard 5 micron graphite with pyrocarbon coating), SCF-IF (hard 5 micron graphite with pyrocarbon infiltration), ZEE (hard 1 micron graphite), ZEE-PYC (hard 1 micron graphite with pyrocarbon coating), ZEE-IF (hard 1 micron graphite with pyrocarbon infiltration), SUPERSiC, SUPERSiC-GS (graphite with SiC composite layer), of a combination of any two or more of these materials. Any of these materials can be used to make the insertable liner, wherein any one or more of these materials are used to form a non-graded liner, surface graded liner, or surface coated liner.

Alternatively, the arc chamber wall or liner can be non-graded but otherwise modified to associate the desired non-tungsten material with material of the arc chamber wall or liner. For example, in another mode of modification, a desired non-tungsten material (graphite, carbide, etc.) is surface coated on all or a portion of the metal surface of the arc chamber wall or liner. In a surface coating the non-tungsten material forms a coated layer on the metal surface, but is not necessarily integrated into the metal. The coated layer can be formed by one of a variety of techniques such as coating the non-tungsten material using heat, coating using pressure, or by sputter coating. The coated layer can be of a desired thickness, such as a thickness in the range of about 1 nanometer to about 5 millimeters. Surface coating can be over all or a portion of the surface (interior) of the arc chamber inner walls.

As noted herein, the different materials of the arc chamber can be described in terms of a percentage of an area of the interior-plasma facing surfaces of the arc chamber. A percentage of the area of the interior-plasma facing surfaces of the arc chamber can include the second, different, arc chamber material. The second arc chamber material can be in the form of a liner, a coating, or a surface grading, on a portion of the inner surfaces. The interior facing surfaces of the arc chamber can include a first sidewall, a second sidewall, a cathode sidewall, an anti-cathode sidewall, a bottom, and a top of the arc chamber. All or a portion of any one or more of these interior-plasma facing surfaces can include the second, different, arc chamber material.

In some embodiments, the arc chamber walls have a total interior-plasma facing surface area and the system includes at least one arc chamber liners comprising the second arc chamber material (e.g., carbide, graphite, etc.), and the at least one arc chamber liners cover an amount of the total interior-plasma facing surface area of the walls in the range of about 1% to about 99%. More specifically, the at least one arc chamber liners covers an amount in the range of about 30% to about 70% of the total interior-plasma facing surface area. Even more specifically, the at least one arc chamber liners covers an amount in the range of about 40% to about 60% of the total interior-plasma facing surface area.

In some embodiments, the system includes at least two arc chamber liners, with a first liner made from a first material such as tungsten, and a second liner made from a second material such as graphite, boride, or carbide as described herein, wherein the second arc chamber liner covers an amount of the total interior-plasma facing surface area of the walls in the range of about 1% to about 99%, about 30% to about 70%, or about 40% to about 60% of the total interior-plasma facing surface area.

In some embodiments, the arc chamber walls have a total interior-plasma facing surface area and the system comprises at least a portion of the interior facing walls that are coated or surface graded with the second arc chamber material (e.g., carbide, graphite, etc.), wherein an amount in the range of about 1% to about 99% of the total interior-plasma facing surface area is coated or surface graded with the second arc chamber material. More specifically, an amount in the range of about 1% to about 99% of the total interior-plasma facing surface area is coated or surface graded with the second arc chamber material. Even more specifically, an amount in the range of about 1% to about 99% of the total interior-plasma facing surface area is coated or surface graded with the second arc chamber material.

In the system of disclosure and as noted herein, the arc chamber can include facing surfaces that include interior facing surfaces of a first sidewall, a second sidewall, a cathode sidewall, an anti-cathode sidewall, a bottom, and a top of the arc chamber. One or more arc chamber liner(s) can be configured to cover any part or all of any one or more of these interior surfaces. In embodiments, the system comprises one arc chamber liner including the second arc chamber material (e.g., carbide, graphite, etc.) that is configured to cover all or a portion of one of the first sidewall, a second sidewall, a cathode sidewall, an anti-cathode sidewall, a bottom, or a top of the arc chamber. In embodiments, the system comprises two, three, four, five, or six arc chamber liners including the second arc chamber material (e.g., carbide, graphite, etc.) that are configured to cover all or a portion of two of the first sidewall, a second sidewall, a cathode sidewall, an anti-cathode sidewall, a bottom, and a top of the arc chamber.

In other embodiments, the system includes two or more arc chamber liners, each being formed from a different material. For example, a first arc chamber liner can be formed from tungsten, and a second arc chamber liner can be formed from a non-tungsten material, such as carbide, graphite, etc. The first arc chamber liner and the second arc chamber liner can be configured to cover any parts or all of two or more of the interior facing surfaces of a first sidewall, a second sidewall, a cathode sidewall, an anti-cathode sidewall, a bottom, and a top of the arc chamber. In some embodiments the system includes a first arc chamber liner configured to cover all of one of the interior facing surfaces as described herein, and a second arc chamber liner configured to cover all of one of the interior facing surfaces as described herein. In yet other embodiments the system provides two or more of arc chamber liners made from a first material (e.g., tungsten) and one arc chamber liner made from a different material (e.g., carbide, graphite, etc.). In yet other embodiments the system provides one arc chamber liners made from a first material (e.g., tungsten) and two or more arc chamber liners made from a different material (e.g., carbide, graphite, etc.). In yet other embodiments the system provides two or more arc chamber liners made from a first material (e.g., tungsten) and two or more arc chamber liners made from a different material (e.g., carbide, graphite, etc.).

In still other embodiments, the second arc chamber material can be provided as a separate piece or target that is mounted in the arc chamber or received in a recess formed in the liner or the arc chamber walls for this purpose. The separate piece may be of any suitable shape or size such that it can be disposed in the arc chamber. In one embodiment, the separate piece includes the second arc chamber material and the arc chamber walls and/or liner includes the first arc chamber material, the first and second arc chamber materials being different from one another. In embodiments, the separate piece is a consumable structure and chemically reacts with the ionizable gas or gas mixture, or ions or neutral generated from the ionizable gas or gas mixture in arc chamber plasma, and produces desired species into plasma. In an embodiment, the separate piece is a sputter target capable of producing desired species into plasma. The second material used to form the separate piece can be any one of graphite (C), boron (B), germanium (Ge), boron nitride (BN), boron oxide ($B_2O_3$), germanium oxide ($GeO_2$), silicon carbide (SiC), tungsten carbide (WC, $W_2C$), tungsten boride (WB, $W_2B$, $WB_2$, $WB_4$), boron carbide ($B_4C$, $B_{12}C_3$), tungsten germanium ($W_2Ge_3$), calcium carbide ($CaC_2$), aluminum carbide ($Al_4C_3$), magnesium carbide ($Mg_2C$), aluminum fluoride ($AlF_3$), gallium fluoride($GaF_3$), indium fluoride ($InF_3$), boron nitride (BN), gallium nitride (GaN), aluminum nitride (AlN), indium nitride (InN), tungsten lanthanum oxide ($WLa_2O_3$), gallium oxide ($Ga_2O_3$), indium oxide ($In_2O_3$), antimony oxide ($Sb_2O_3$) or aluminum oxide ($Al_2O_3$). In some cases, the selection of the second material used to form the separate piece or target can be selected based on the gas or gas mixture to be ionized by the ion implantation system. Because the piece is separate, it may be removed and replaced with a different material depending on the desired ion implant application. Also, if consumable, once consumed, the separate piece can be replaced with a new separate piece.

In use, a gas or gas mixture capable of generating ionic species can be flowed into the arc chamber containing the at least two different arc chamber materials at a predetermined flow rate. The gas or gas mixture is an ionizable gas or gas mixture that includes one or more species to be implanted in a substrate during an ion implantation process. Upon application of a predetermined power and voltage in the arc chamber, ionic species can be generated from the gas or gas mixture, with the species including one or more desired ionic species for implantation into the substrate. Using optimized operating conditions of the system, the beam current of the desired ionic species is increased to a greater extent than any of the other ionic species due to the presence of the second arc chamber material, relative to the beam currents of the ionic species generated without the second arc chamber material under the same operating conditions. Using this method, the ionic species with the greatest beam current can be selected for implantation into the substrate. In some cases, a bias voltage can be applied to the arc chamber liner(s), portions of the arc chamber forming the arc chamber liner, or the separate piece disposed in the arc chamber.

Gases for ionization in combination with at least two different arc chamber materials include, but are not limited to silicon containing gases, boron containing gases, germanium containing gases, carbon containing gases, phosphorus containing gases, arsenic containing gases, antimony containing gases, tungsten containing gases, nitrogen containing gases, gallium containing gases, indium containing gases, aluminum containing gases, fluorine containing gases, tin containing gases, or hydrogen containing gases. In some embodiments, the gas can be an enriched gas isotopically enriched in one or more isotopes relative to their natural abundance. Exemplary enriched gases include an isotopically enriched boron containing gas including with isotopically enriched boron in B-11 isotope and an isotopically enriched germanium-containing gas enriched in one or more germanium isotopes such as Ge-72 isotope. The ionizable gas can be co-flowed or provided in mixture with at least one other gas. The at least one other gas can include a co-gas which contains the same species as the ionizable gas, and/or a diluent or carrier gas.

Examples of specific gases for ionization in in combination with at least two different chamber materials include, but are not limited to, $SiF_4$, $Si_2F_6$, $Si_2H_4$, $SiHF_3$, $SiH_2F_2$, $Si_2H_3F_3$, $Si_2H_5F$, $Si_2HF_5$, $BF_3$, $B_2F_4$, $B_2H_6$, BHF, $BHF_2$, $GeF_4$, $Ge_2F_6$, $GeH_4$, $GeHF_3$, $GeH_2F_2$, $GeH_3F$, $PF_3$, $PF_5$, $PH_3$, $PHF_2$, $PH_2F$, $PH_3F_2$, $P_2HF$, $AsHF_2$, $AsH_2F$, $AsH_3F_2$, $AsF_3$, $AsF_5$, $AsH_3$, $SbF_5$, $WF_6$, $NF_3$, $N_2F_4$, $NH_3$, $NHF_2$, $NH_2F$, NHF, and $N_2H_3F$, CO, $COF_2$, $CH_4$, $CF_4$, $C_2F_6$ and gases having the following general formula $C_nH_xF_{2n+2-x}$, $C_nH_xF_{2n-x}$, $C_nH_xF_{2n-2-x}$, wherein n is an integer in the range of 1-3, and x is 0, 1, or 2. Examples of enriched gases for ionization in in combination with at least two different chamber materials include, but are not limited to, isotopically enriched $BF_3$ gas and isotopically enriched $GeF_4$ gas.

Referring now to the drawings, FIG. 1 is a schematic representation of an ion implantation system 10, including an arc chamber 12 with a gas feed line 14 for feeding an ion-generating gas (e.g., fluoride gas) to the arc chamber for ionization thereof in the chamber. The arc chamber 12 includes two or more arc chamber materials, at least one of the materials or liners being formed from a non-tungsten material.

Referring now to the drawings, FIG. 1 is a schematic representation of an ion implantation system 10, including an arc chamber 12 with a gas feed line 14 for feeding an ion-forming gas, such as fluoride gas, to the arc chamber for ionization thereof in the chamber. The arc chamber 12 thus provides an ion source chamber that includes two or more different arc chamber materials as disclosed herein. The use of the two different arc chamber materials can provide benefits such as improved beam current, reduced source power, longer source life, lower gas flow, and reduced buildup of unwanted contaminants in the chamber, or any combination thereof.

Figure 2:
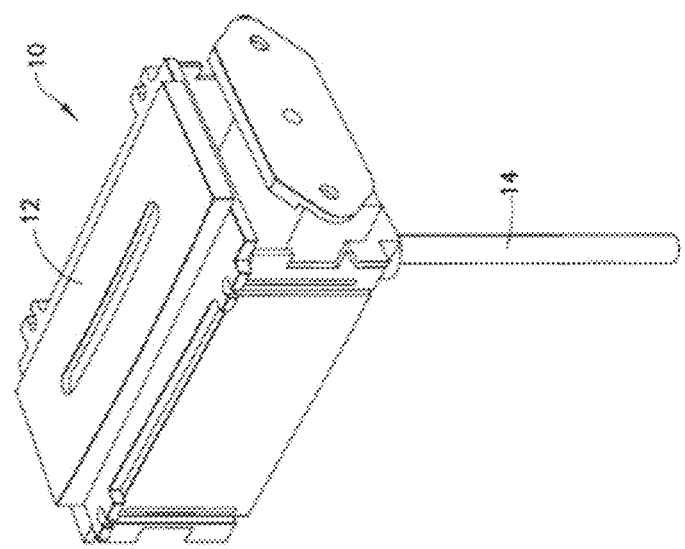
FIG. 2 is a cross section of the FIG. 1 ion implantation system schematically showing the generation of a plasma in the arc chamber of such system.

FIG. 2 is a cross section of the FIG. 1 ion implantation system 10 schematically showing the generation of a plasma 16 in the arc chamber in 12 of such system. The gas (e.g., fluoride gas) is flowed in the direction indicated by arrow A into the gas feed line 14, having monitoring thermocouples TC1 and TC2 secured thereto in monitoring relationship to determine the quality of the thermal state of the feed line and gas entering the arc chamber, as may be desirable in connection with the use of a thermal management system for the ion implantation system.

Figure 3:
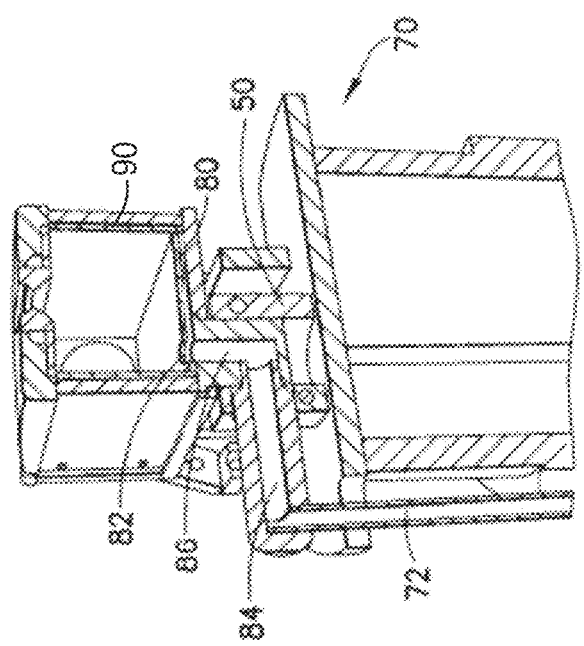
FIG. 3 is a perspective view, in cross-section, of an ion source assembly comprising an ion source apparatus.

FIG. 3 is a perspective view, in cross-section, of the ion source assembly comprising the ion source apparatus 70 and an optional heat sink apparatus 50 for thermal management of the system. This cross-sectional view shows the gas feed line 72 connecting to gas flow passage 84 in the gas feed plug and to the gas flow passage 86 in the gas bushing associated with the ion source.

The ion source apparatus shown in FIG. 3 includes a base liner 80 that is made from a first arc chamber material. The base liner 80 can include an opening 82 therein. The ion source apparatus shown in FIG. 3 also includes a side liner 90 that is made from a second arc chamber material different than the first arc chamber material. In one embodiment, the first arc chamber material is a tungsten containing material and the second arc chamber material is a non-tungsten containing material. The first and second arc chamber materials can be selected from the materials previously disclosed herein.

Figure 4:
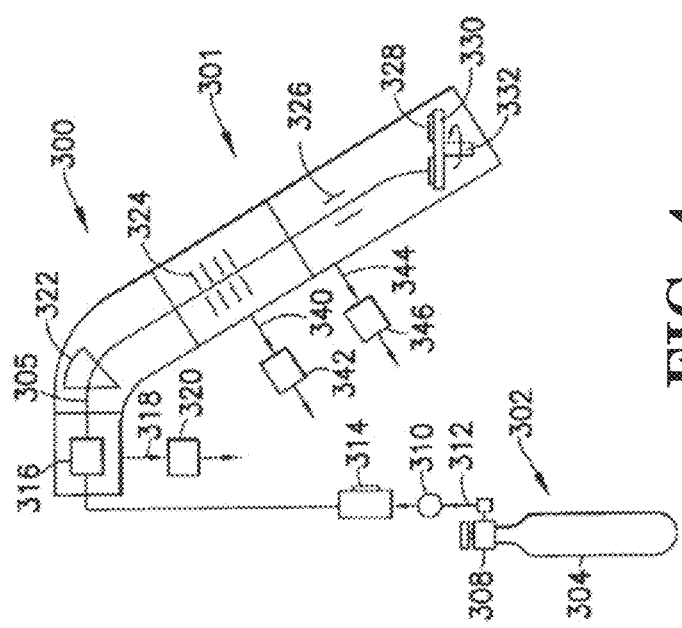
FIG. 4 is a schematic representation of an ion implant process system including a storage and dispensing vessel containing gas which is supplied for ion implantation doping of a substrate in the illustrated ion implant chamber.

FIG. 4 is a schematic representation of an ion implant process system 300 including a storage and dispensing vessel 302 holding a reactant gas which is supplied for in situ reaction with an ion-generating gas in the ion source chamber to generate an ionic species for ion implantation of a substrate 328 in the illustrated ion implant chamber 301. The storage and dispensing vessel 302 comprises a vessel wall 304 enclosing an interior volume holding the gas.

The vessel may be a gas cylinder of conventional type, with an interior volume arranged to hold only gas, or alternatively, the vessel may contain a sorbent material having sorptive affinity for the reactant gas, and from which the co-reactant source gas is desorbable for discharge from the vessel under dispensing conditions.

The storage and dispensing vessel 302 includes a valve head 308 coupled in gas flow communication with a discharge line 312. A pressure sensor 310 is disposed in the line 312, together with a mass flow controller 314. Other monitoring and sensing components may be coupled with the line, and interfaced with control means such as actuators, feedback and computer control systems, cycle timers, etc.

The ion implant chamber 301 contains an ionizer 316 receiving the dispensed ion-generating gas (e.g., fluoride gas) from line 312 that under the ionization conditions in the ionizer chamber produce an ion beam 305. The ion beam 305 passes through the mass analyzer unit 322 which selects the ions needed and rejects the non-selected ions.

The selected ions pass through the acceleration electrode array 324 and then the deflection electrodes 326. The resultingly focused ion beam is impinged on the substrate element 328 disposed on the rotatable holder 330 mounted in turn on spindle 332, to form a doped (fluoride-doped) substrate as the ion implantation product.

The respective sections of the ion implant chamber 301 are exhausted through lines 318, 340 and 344 by means of pumps 320, 342 and 346, respectively.

Figure 5:
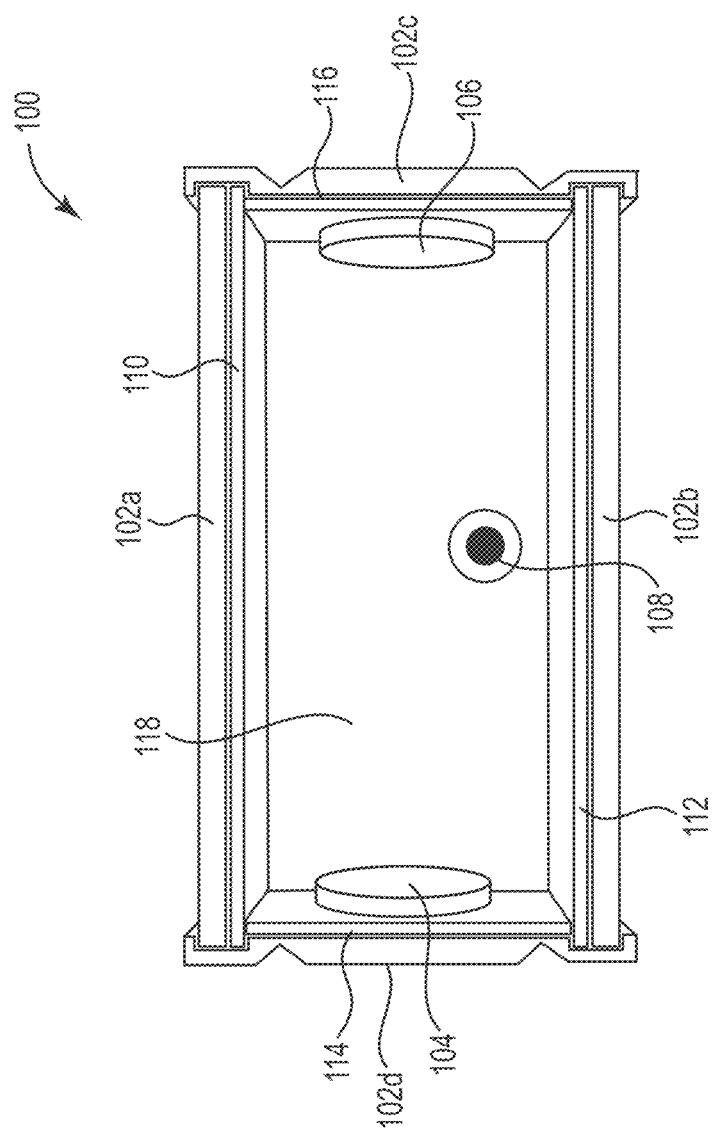
FIG. 5 is a top-down view of an ion source chamber as described, containing different liners.

FIG. 5 is a top-down view of an interior of an ion source chamber 100 that includes arc chamber walls 102a, 102b, 102c, and 102d. In the chamber at one end is cathode 104, and at the other end anti-cathode 106. The arc chamber walls are covered with arc chamber liners 110, 112, 114, and 116, on the side walls, and also arc chamber liner 118 on the bottom side. On the bottom wall there is also a gas input opening 108. In embodiments, one, two, three, four, or five of arc chamber liners 110, 112, 114, 116 and/or 118 can be made from different materials selected from a tungsten material or a non-tungsten material, such as graphite (C), boron (B), germanium (Ge), boron nitride (BN), boron oxide ($B_2O_3$), germanium oxide ($GeO_2$), silicon carbide (SiC), tungsten carbide (WC, $W_2C$), tungsten boride (WB, $W_2B$, $WB_2$, $WB_4$), boron carbide ($B_4C$, $B_{12}C_3$), tungsten germanium ($W_2Ge_3$), calcium carbide ($CaC_2$), aluminum carbide ($Al_4C_3$), magnesium carbide ($Mg_2C$), aluminum fluoride ($AlF_3$), gallium fluoride($GaF_3$), indium fluoride ($InF_3$), boron nitride (BN), gallium nitride (GaN), aluminum nitride (AlN), indium nitride (InN), tungsten lanthanum oxide ($WLa_2O_3$), gallium oxide ($Ga_2O_3$), indium oxide ($In_2O_3$), antimony oxide ($Sb_2O_3$) or aluminum oxide ($Al_2O_3$). In embodiments, one or more of the non-tungsten liner(s) is made from boride, carbide, or a graphite material.

Figure 6:
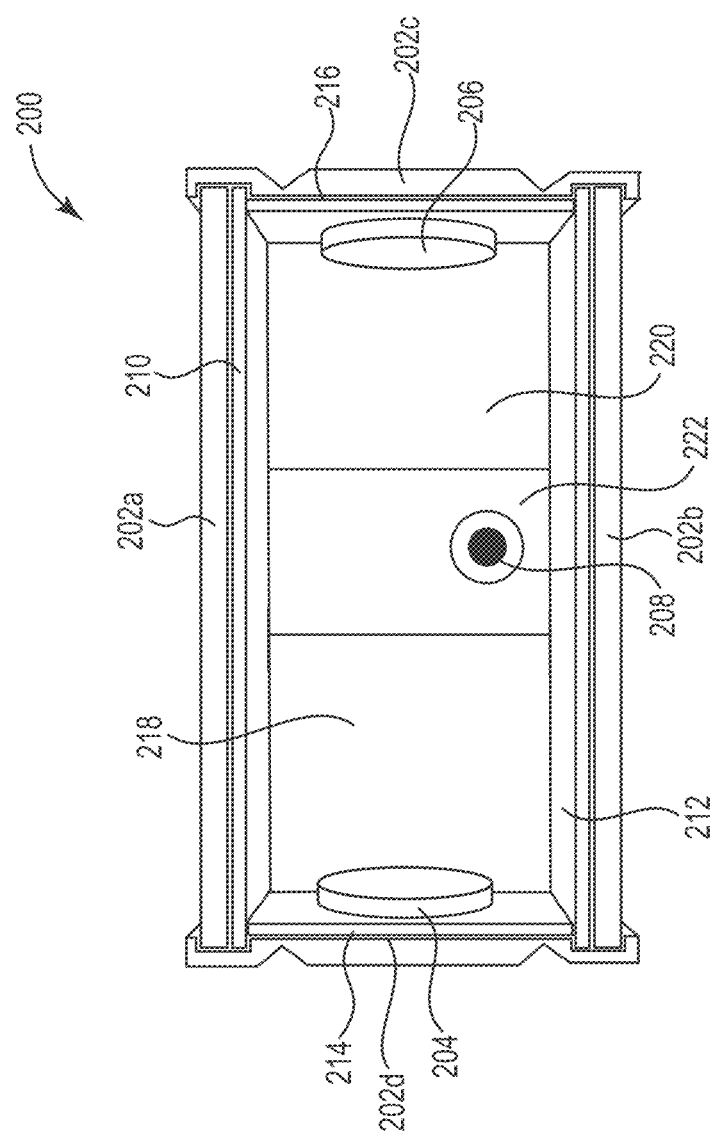
FIG. 6 is a top-down view of an ion source chamber as described, containing different liners.

FIG. 6 is a top-down view of an interior of another ion source chamber 200 that includes arc chamber walls 202a, 202b, 202c, and 202d. In the chamber at one end is cathode 204, and at the other end anti-cathode 106. The arc chamber walls are covered with arc chamber liners 210, 212, 214, and 216, on the side walls, and also arc chamber liners 218, 220, and 222 on the bottom side. On the bottom wall there is also a gas input opening 208. In embodiments, one, two, three, four, five, or six of arc chamber liners 210, 212, 214, 216, 218, 220 and/or 222 can be made from different materials selected from a tungsten material or non-tungsten materials such as graphite (C), boron (B), germanium (Ge), boron nitride (BN), boron oxide ($B_2O_3$), germanium oxide ($GeO_2$), silicon carbide (SiC), tungsten carbide (WC, $W_2C$), tungsten boride (WB, $W_2B$, $WB_2$, $WB_4$), boron carbide ($B_4C$, $B_{12}C_3$), tungsten germanium ($W_2Ge_3$), calcium carbide ($CaC_2$), aluminum carbide ($Al_4C_3$), magnesium carbide ($Mg_2C$), aluminum fluoride ($AlF_3$), gallium fluoride($GaF_3$), indium fluoride ($InF_3$), boron nitride (BN), gallium nitride (GaN), aluminum nitride (AlN), indium nitride (InN), tungsten lanthanum oxide ($WLa_2O_3$), gallium oxide ($Ga_2O_3$), indium oxide ($In_2O_3$), antimony oxide ($Sb_2O_3$) or aluminum oxide ($Al_2O_3$). In embodiments, one or more of the two different non-tungsten liner(s) is made from carbide, and one or more of the other of the different non-tungsten liner(s) is of the or a graphite material.

Figure 7A:
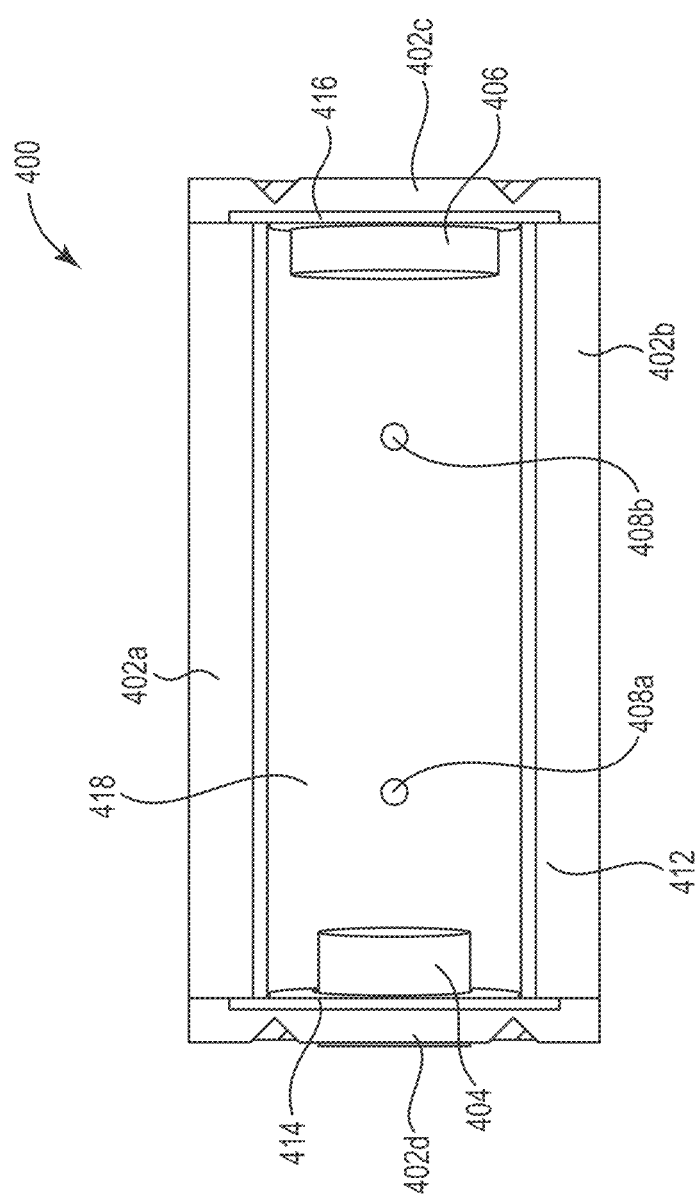
FIG. 7A is a top-down view of an ion source chamber as described, containing different liners. The first side liner, the second side liner and the bottom liner are in one piece.

FIG. 7A is a top-down view of an interior of an ion source chamber 400. Ion source chamber 400 includes arc chamber walls 402a, 402b, 402c, and 402d. In the chamber at one end is cathode 404, and at the other end anti-cathode 406. The arc chamber walls 402d and 402c are covered with arc chamber liners 414, and 416, respectively. Arc chamber liner 418 is a nonplanar one-piece liner that covers the side walls 402a and 402b, and the bottom side of the chamber. On the bottom there are also gas input openings 408a and 408b. In embodiments, one, two, or all three of arc chamber liners 414, 416 and/or 418 can be made from a tungsten material or a non-tungsten material, such as graphite (C), boron (B), germanium (Ge), boron nitride (BN), boron oxide ($B_2O_3$), germanium oxide ($GeO_2$), silicon carbide (SiC), tungsten carbide (WC, $W_2C$), tungsten boride (WB, $W_2B$, $WB_2$, $WB_4$), boron carbide ($B_4C$, $B_{12}C_3$), tungsten germanium ($W_2Ge_3$), calcium carbide ($CaC_2$), aluminum carbide ($Al_4C_3$), magnesium carbide ($Mg_2C$), aluminum fluoride ($AlF_3$), gallium fluoride($GaF_3$), indium fluoride ($InF_3$), boron nitride (BN), gallium nitride (GaN), aluminum nitride (AlN), indium nitride (InN), tungsten lanthanum oxide ($WLa_2O_3$), gallium oxide ($Ga_2O_3$), indium oxide ($In_2O_3$), antimony oxide ($Sb_2O_3$) or aluminum oxide ($Al_2O_3$). In embodiments, one or more of the non-tungsten liner(s) is made from boron, boride, carbide or a graphite material.

Figure 7B:
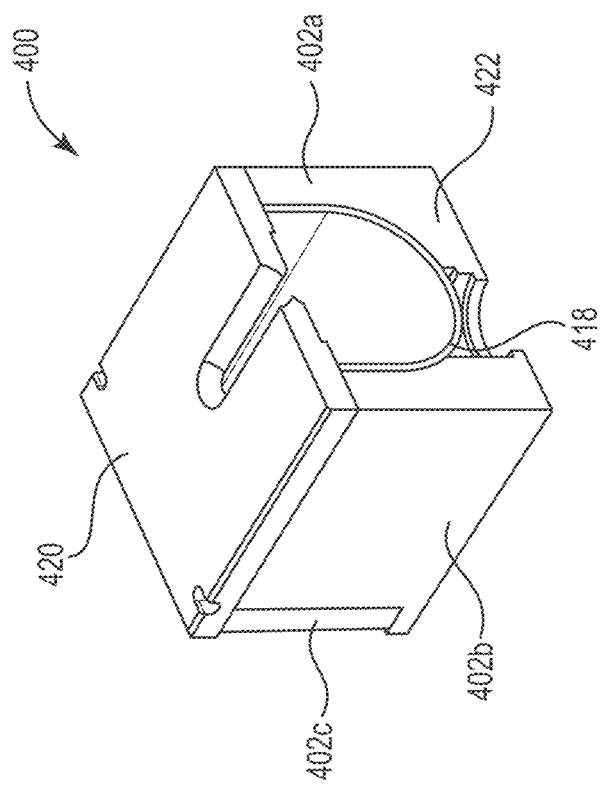
FIG. 7B is a side cross section view of an ion source chamber as described, containing different liners. The first side liner, the second side liner and the bottom liner are in one piece.

FIG. 7B is perspective cross sectional view of the ion source chamber 400 of FIG. 7A. Arc chamber walls 402a, 402b, and 402c are shown. The ion source chamber 400 also includes top cover 420. Arc chamber liner 418, which has a "U-shape" as seen from the cross section, is a one-piece liner that covers the interior facing surfaces of side walls 402a and 402b, and also the bottom 422. While a non-planar U-shaped arc chamber liner is shown in FIGS. 7A and 7B, the system can include other one-piece arc chamber liners of other shapes (e.g., "L-shaped", "V-shaped," etc.) that are able to covering two or more adjacent surfaces of the interior of the arc chamber, such as two, three, four, or five surfaces selected from the first sidewall, the second sidewall, the cathode sidewall, the anti-cathode sidewall, the bottom, and the top.

The system and method of the disclosure can include or use a gas source that provides a gas that is ionizable to one or more desired ionic species. In some embodiments, the gas source includes one or more ionizable silicon containing gases including, but not limited to, $SiF_4$, $Si_2F_6$, $Si_2H_6$, $SiHF_3$, $SiH_2F_2$, $SiH_3F$, $Si_2H_3F_3$, $Si_2H_5F$, and $Si_2HF_5$. In some embodiments, the gas source includes one or more ionizable boron containing gases including, but not limited to, $BF_3$, $B_2F_4$, $B_2H_6$, BHF, and $BHF_2$. In some embodiments, the gas source includes one or more ionizable germanium containing gases including, but not limited to, $GeF_4$, $Ge_2F_6$, $GeH_4$, $Ge_2H_6$, $GeHF_3$, $GeH_2F_2$, and $GeH_3F$. In some embodiments, the gas source includes one or more ionizable phosphorus containing gases including but not limited to $PF_3$, $PF_5$, $PH_3$, $PHF_2$, $PH_2F$, $PHF_3$ and $P_2H_4$. In some embodiments, the gas source includes one or more ionizable arsenic containing gases including, but not limited to, $AsHF_2$, $AsH_2F$, $AsHF_2$, $AsF_3$, $AsF_5$, and $AsH_3$. In some embodiments, the gas source includes one or more ionizable antimony containing gases including $SbH_3$ and $SbF_5$. In other embodiments, the gas source can include $WF_6$. In some embodiments, the gas source can include one or more ionizable nitrogen containing gases including, but not limited to $NF_3$, $N_2F_4$, $NH_3$, $NHF_2$, $NH_2F$, and $N_2H_3F$. In some embodiments, the gas source can include one or more ionizable carbon containing gases including, but not limited to, CO, $COF_2$, $CH_4$, $CF_4$, $C_2F_6$ and gases having the following general formula $C_nH_xF_{2n+2-x}$, $C_nH_xF_{2n-x}$, $C_nH_xF_{2n-2-x}$, wherein n is an integer in the range of 1-3, and x is 0, 1, or 2. In still yet other embodiments, the gas source includes one or more ionizable fluorine containing gases, such as disclosed herein, capable of generating a $C^+$ ion, a $B^+$ ion, a $N^+$ ion, a r ion, a $Si^+$ ion, an $Ge^+$ ion, a $P^+$ ion, an $As^+$ ion, a $Ga^+$ ion, a $Sb^+$ ion, a $In^+$ ion, a $Al^+$ ion species when ionized. In some embodiments, the gas source includes one or more ionizable inert gases selected from the group consisting of He, Ne, Ar, Kr, Xe and $N_2$. Additionally, if two or more different ionizable gases are used, these may be flowed into the implantation chamber independently, or can be flowed as a mixture into the chamber.

In preferred embodiments, a gas source for the ion implantation of a boron species can include: $BF_3$ gas, $B_2F_4$ gas, or $B_2H_6$ gas; or a gas mixture containing a first boron containing gas including $BF_3$ gas, $B_2F_4$ gas, or $B_2H_6$ gas, a second boron containing gas including $BF_3$ gas, $B_2F_4$ gas, or $B_2H_6$ and/or a diluent gas such as hydrogen gas, a noble gas (He, NE, Ar, Kr, Xe) or a mixture of hydrogen gas with noble gas (e.g. Xe/$H_2$). The gas source, as described herein, is delivered to an arc chamber including a first arc chamber material including tungsten and a second arc chamber material including a boron containing material such as elemental boron, boron carbide, boron nitride, boron oxide, tungsten boride. The first and second arc chamber materials can be a first liner material and a second liner material, respectively. In one embodiment, the first liner material includes tungsten and the second liner includes boron nitride. In another embodiment, the first liner material includes tungsten and the second liner material includes boron carbide. In yet another embodiment, the first liner material includes tungsten and the second liner material includes tungsten boride. In yet another embodiment the first liner material includes tungsten and a second liner material includes boron oxide. In still yet another embodiment, the first liner material includes tungsten and the second liner material includes elemental boron.

In one preferred embodiment, an ionizable gas source including $BF_3$ can be flowed into an arc chamber where a first arc chamber material is tungsten and a second arc chamber material is one of elemental boron, boron oxide, boron nitride, boron carbide or tungsten boride. The first arc chamber material can form all or a portion of a first liner and the second arc chamber material can form all or a portion of a second liner. In some cases, the ionizable gas source is a gas mixture including $BF_3$ and hydrogen. The $BF_3$ can be isotopically enriched, but this is not required.

Without wishing to be bound to any theory, it is believed that an ionizable gas generates reactive ionic or neutral species such as $BF_3+$, $BF+$, $F+$, $BF_2$, BF, F that can chemically react with the second liner material and preferentially volatilize boron species from the second liner material for further ionization in arc chamber plasma. The volatilized boron species increase the concentration of boron-containing species in plasma and consecutively increases beam current of desired boron-containing ions such as B+ or $BF_2+$. Further, a gas mixture may include one or more gases that can facilitate volatilization of boron species from the second liner through chemical reaction or sputtering. Examples of such gases are $F_2$, $NF_3$, $N_2F_4$, $XeF_2$ for enhancing chemical reaction or noble gases for enhancing sputtering. In addition, a gas mixture may include one or more gases that can suppress unwanted effects that reduce volatilization of desired boron species or enhance volatilization of unwanted species such tungsten fluorides. An example of such a gas includes $H_2$ or other hydrogen containing gas that can bind free fluorine that can case excessive volatilization of tungsten.

In another embodiment, an ionizable gas including $CF_4$ can be flowed into an arc chamber where a first arc chamber material is graphite and a second arc chamber material is tungsten. In some cases, the ionizable gas is a gas mixture including $CF_4$ and hydrogen.

In another embodiment, an ionizable gas including $GeF_4$ can be flowed into an arc chamber where a first arc chamber material is graphite and a second arc chamber material is tungsten. In some cases, the ionizable gas is a gas mixture including $GeF_4$ and hydrogen. Additionally, in some cases, the $GeF_4$ can be isotopically enriched.

In another embodiment, an ionizable gas including $BF_3$ can be flowed into an arc chamber where a first arc chamber material is graphite and a second arc chamber material is tungsten. In some cases, the ionizable gas is a gas mixture including $BF_3$ and hydrogen. Additionally, in some cases, the $BF_3$ can be isotopically enriched.

In another embodiment, an ionizable gas including $SiF_4$ can be flowed into an arc chamber where a first arc chamber material is graphite and a second arc chamber material is tungsten. In some cases, the ionizable gas is a gas mixture including $SiF_4$ and hydrogen.

In another embodiment, an ionizable gas including $CF_4$ can be flowed into an arc chamber where a first arc chamber material is silicon carbide and a second arc chamber material is tungsten. In some cases, the ionizable gas is a gas mixture including $CF_4$ and hydrogen.

In another embodiment, an ionizable gas including $GeF_4$ can be flowed into an arc chamber where a first arc chamber material is silicon carbide and a second arc chamber material is tungsten. In some cases, the ionizable gas is a gas mixture including $GeF_4$ and hydrogen. Additionally, in some cases, the $GeF_4$ can be isotopically enriched.

In another embodiment, an ionizable gas including $BF_3$ can be flowed into an arc chamber where a first arc chamber material is silicon carbide and a second arc chamber material is tungsten. In some cases, the ionizable gas is a gas mixture including $BF_3$ and hydrogen. Additionally, in some cases, the $BF_3$ can be isotopically enriched.

In another embodiment, an ionizable gas including $SiF_4$ can be flowed into an arc chamber where a first arc chamber material is silicon carbide and a second arc chamber material is tungsten. In some cases, the ionizable gas is a gas mixture including $SiF_4$ and hydrogen. In another embodiment, an ionizable gas including $CF_4$ can be flowed into an arc chamber where a first arc chamber material is tungsten, a second arc chamber material is graphite and a third arc chamber material is silicon carbide. In some cases, the ionizable gas is a gas mixture including $CF_4$ and hydrogen.

In another embodiment, an ionizable gas including $GeF_4$ can be flowed into an arc chamber where a first arc chamber material is tungsten, a second arc chamber material is graphite and a third arc chamber material is silicon carbide. In some cases, the ionizable gas is a gas mixture including $GeF_4$ and hydrogen. Additionally, in some cases, the $GeF_4$ can be isotopically enriched.

In another embodiment, an ionizable gas including $BF_3$ can be flowed into an arc chamber where a first arc chamber material is tungsten, a second arc chamber material is graphite and a third arc chamber material is silicon carbide. In some cases, the ionizable gas is a gas mixture including $BF_3$ and hydrogen. Additionally, in some cases, the $BF_3$ can be isotopically enriched.

In another embodiment, an ionizable gas including $SiF_4$ can be flowed into an arc chamber where a first arc chamber material is tungsten, a second arc chamber material is graphite and a third arc chamber material is silicon carbide. In some cases, the ionizable gas is a gas mixture including $SiF_4$ and hydrogen.

In another embodiment, an ionizable gas including $CF_4$ can be flowed into an arc chamber where a first arc chamber material is tungsten, a second arc chamber material is graphite and a third arc chamber material is silicon carbide. In some cases, the ionizable gas is a gas mixture including $CF_4$ and hydrogen.

In another embodiment, an ionizable gas including $GeF_4$ can be flowed into an arc chamber where a first arc chamber material is tungsten, a second arc chamber material is graphite and a third arc chamber material is silicon carbide. In some cases, the ionizable gas is a gas mixture including $GeF_4$ and hydrogen. Additionally, in some cases, the $GeF_4$ can be isotopically enriched.

In another embodiment, an ionizable gas including $BF_3$ can be flowed into an arc chamber where a first arc chamber material is tungsten, a second arc chamber material is graphite and a third arc chamber material is silicon carbide. In some cases, the ionizable gas is a gas mixture including $BF_3$ and hydrogen. Additionally, in some cases, the $BF_3$ can be isotopically enriched.

In another embodiment, an ionizable gas including $SiF_4$ can be flowed into an arc chamber where a first arc chamber material is tungsten, a second arc chamber material is graphite and a third arc chamber material is silicon carbide. In some cases, the ionizable gas is a gas mixture including $SiF_4$ and hydrogen.

In another embodiment, an ionizable gas including $CF_4$ can be flowed into an arc chamber where a first arc chamber material is tungsten carbide, a second arc chamber material is tungsten, and a third arc chamber material includes graphite or silicon carbide. In some cases, the ionizable gas is a gas mixture including $CF_4$ and hydrogen.

In another embodiment, an ionizable gas including $GeF_4$ can be flowed into an arc chamber where a first arc chamber material is tungsten carbide, a second arc chamber material is tungsten, and a third arc chamber material includes graphite or silicon carbide. In some cases, the ionizable gas is a gas mixture including $GeF_4$ and hydrogen. Additionally, in some cases, the $GeF_4$ can be isotopically enriched.

In another embodiment, an ionizable gas including $BF_3$ can be flowed into an arc chamber where a first arc chamber material is tungsten carbide, a second arc chamber material is tungsten, and a third arc chamber material includes graphite or silicon carbide. In some cases, the ionizable gas is a gas mixture including $BF_3$ and hydrogen. Additionally, in some cases, the $BF_3$ can be isotopically enriched.

In another embodiment, an ionizable gas including $SiF_4$ can be flowed into an arc chamber where a first arc chamber material is tungsten carbide, a second arc chamber material is tungsten, and a third arc chamber material includes graphite or silicon carbide. In some cases, the ionizable gas is a gas mixture including $SiF_4$ and hydrogen.

In another embodiment, an ionizable gas including $CF_4$ can be flowed into an arc chamber where a first arc chamber material is tungsten boride, a second arc chamber material is tungsten, and a third arc chamber material includes graphite or silicon carbide. In some cases, the ionizable gas is a gas mixture including $CF_4$ and hydrogen.

In another embodiment, an ionizable gas including $GeF_4$ can be flowed into an arc chamber where a first arc chamber material is tungsten boride, a second arc chamber material is tungsten, and a third arc chamber material includes graphite or silicon carbide. In some cases, the ionizable gas is a gas mixture including $GeF_4$ and hydrogen. Additionally, in some cases, the $GeF_4$ can be isotopically enriched.

In another embodiment, an ionizable gas including $BF_3$ can be flowed into an arc chamber where a first arc chamber material is tungsten boride, a second arc chamber material is tungsten, and a third arc chamber material includes graphite or silicon carbide. In some cases, the ionizable gas is a gas mixture including $BF_3$ and hydrogen. Additionally, in some cases, the $BF_3$ can be isotopically enriched.

In another embodiment, an ionizable gas including $SiF_4$ can be flowed into an arc chamber where a first arc chamber material is tungsten boride, a second arc chamber material is tungsten, and a third arc chamber material includes graphite or silicon carbide. In some cases, the ionizable gas is a gas mixture including $SiF_4$ and hydrogen.

In the presence of the arc chamber that uses two or more different materials such as described herein there are benefits for implantation of ionic species at predetermined gas flow rates. For example, using an arc chamber with two different materials, a substantially higher beam current for certain ionic species can be achieved at gas flow rates that otherwise provide lower beam currents for those ionic species when mixtures of different arc chamber materials are not used. Since a higher ionic species beam current can be achieved using a mixture of arc chamber materials, this allows the user to reduce the flow rate of the ionizable gas in certain modes of practice, and this can in turn provide various processing benefits, such as reduction of overall reagent consumption, less equipment maintenance, and increased lifetime of implantation equipment.

Also, the use of the mixture of different arc chamber materials can provide higher beam currents for certain ionic species generated upon ionization of the ionic species-generating gas. This can be beneficial for the implantation of certain ionic species that have higher beam currents, while minimizing the implantation of other ionic species that have lower beam currents, relative to the beam currents observed for those species when mixtures of different arc chamber materials are not used. Therefore, the disclosure provides methods for selectively depositing desired ions into a substrate which can ultimately improves product properties and performance.

Even further, the use of the mixture of different arc chamber materials can provide lower amounts of undesirable ionic species that are generated during the deposition process. If the arc implantation chamber is formed using, in part, a tungsten-containing material, ionization of the gas source can cause generation of ionic species such as $W^{++}$, $WF_x^{++}$, $W^+$, and $WF_x^+$ (x=1, 2, 3, 4, 5, 6). The use of a non-tungsten material in the chamber, such as a graphite or carbide liner, can decrease the amounts of $W^{++}$, $WF_x^{++}$, $W^+$, and $WF_x^+$ (x=1, 2, 3, 4, 5, 6) ionic species generated during the deposition process as compared to a system that does not use a non-tungsten liner. Since these tungsten ionic species can unwantedly be deposited in the implantation chamber the reduction can improve the deposition process, decrease maintenance of the implantation equipment, and increase overall life the equipment.

Operation of the system for ion implantation can be described in terms of the flow of the ion-generating gas into the chamber. During the process, the ion-generating gas is flowed into the implantation chamber at a desired flow rate and manner. The rate of flow of the ion-generating gas can be maintained at a constant flow rate, or optionally fluctuated during the deposition process. In some modes of practice, the flow of the ion-generating gas (e.g., fluoride gas) is flowed into the chamber at a rate not greater than 10 sccm, and in embodiments, ion-generating gas is flowed at a rate in the range of 0.1 sccm to 6 sccm, or in the range of 0.3 sccm to 4 sccm.

Operation of the system for ion implantation can be described in terms of arc power and arc voltage. In some modes of practice, the system is operated to provide an arc power in the range of about 5 W to about 2000 W, or in some modes of practice an arc power is in the range of about 90 W to about 1500 W. In order to achieve an arc power in one of these ranges, the system can be operated so arc power is generated at an arc voltage in the range of about 20 V to about 200 V, or more specifically is in the range of about 30 V to about 150 V, or in the range of about 40 V to about 130 V.

Operation of the system for ion implantation can also be described in terms of the flow rate of the gas source containing the ionizable compound into the ion implantation chamber. In some embodiments, ionizable gas is flowed into the chamber at a rate not greater than 10 sccm, and in embodiments, the fluoride compound is flowed at a rate in the range of 0.1 sccm to 6 sccm.

If more than one gas is flowed to the chamber the gases can be flowed individually. Alternatively, the gases can be flowed in mixture. For example, any two or more of the fluoride, hydrogen-containing, oxygen-containing and/or inert gases can be pre-mixture in gas cylinder package. In yet other embodiments, two or more gases are in mixture and then another gas is individually flowed to the chamber.

EXAMPLES

Example 1

Figure 8:
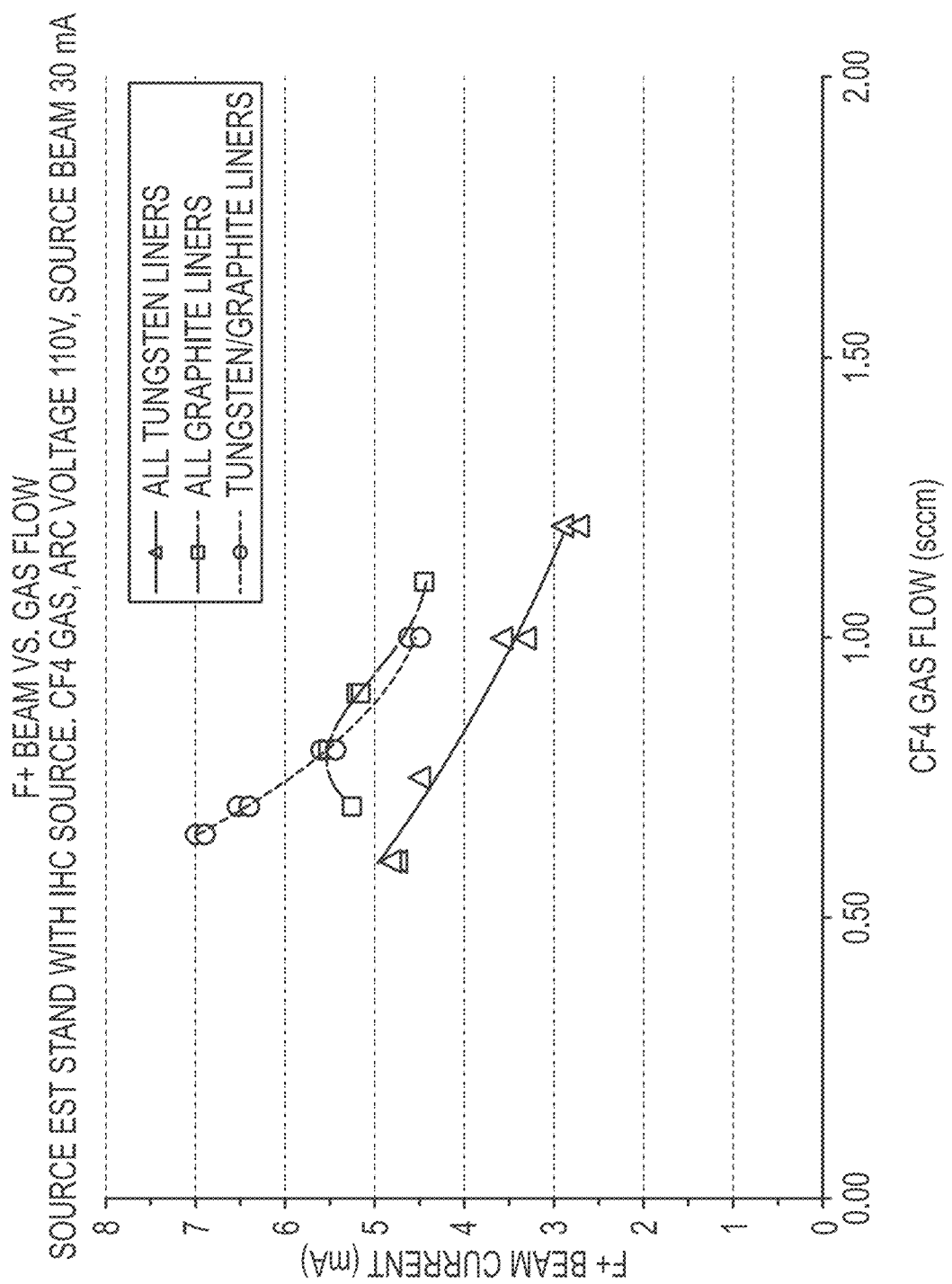
FIG. 8 shows $F^+$ beam current data from experiments using a $CF_4$ gas in the presence of a mixed tungsten/graphite liner, which produced a higher r beam at lower gas flow rates, versus graphite and tungsten liners.

A fluoride gas, $CF_4$, was flowed into an ionization chamber having a tungsten liner and an ionization chamber having graphite and tungsten liners. The system was operated at an arc voltage of 110V and source beam of 30 mA. F+ ion beam current was measured at various gas $CF_4$ flow rates, and compared to the F+ ion beam current in ionization chambers having either a graphite liner, or a tungsten liner. At each flow rate tested, the system with the graphite and tungsten liners provided higher $F^+$ beam currents as compared to the system with the tungsten liner, and similar or higher $F^+$ beam currents as compared to the system with the graphite liner. Results are shown in FIG. 8.

Example 2

Figure 9:
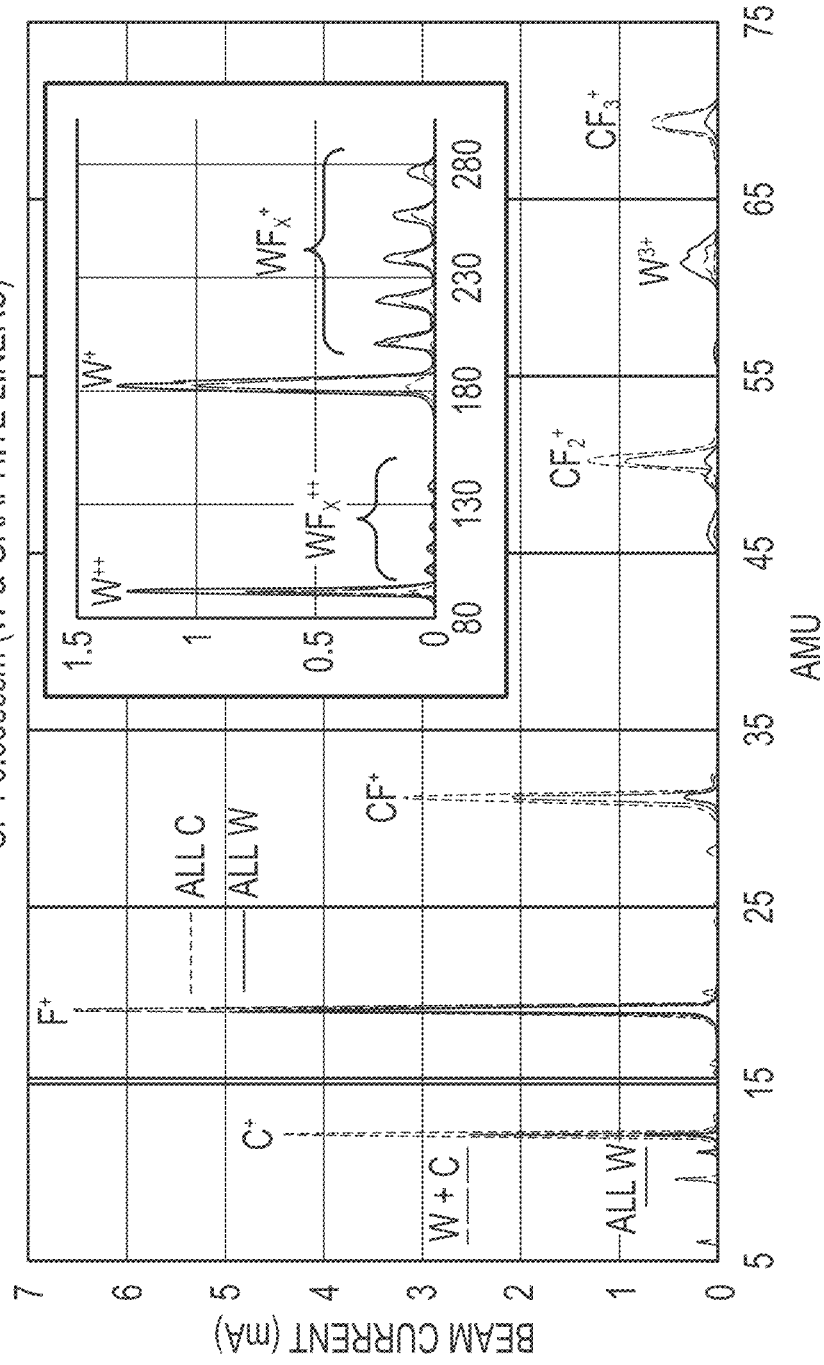
FIG. 9 shows ionized species from experiments using $CF_4$ gas, with a higher r beam, using a mixed tungsten/graphite liner versus graphite and tungsten liners, and lower $W^+$ and $WF_x^+$ beams when using versus a tungsten liner.

The beam spectrums of various ionized species resulting from the processes described in Example 1 were determined. Results show that from the beam spectrum generated from ionized species of $CF_4$, a higher $F^+$ ion beam was observed when graphite and tungsten liners were used over either a graphite liner, or a tungsten liner. However, the other species derived from $CF_4$ ($C^+$, $CF^+$, $CF_2^+$, and $CF_3^+$) had beam currents that were higher when a graphite liner was used as the sole liner, as opposed to graphite and tungsten liners used together, or a tungsten liner used by itself. Therefore, use of the graphite and tungsten liners together allows a selective improvement for $F^+$ ion beam generation, which in turn improves $F^-$ implantation while minimizing implantation of carbon-containing ionic species. Further, a lower $W^+$ and $WF_x^+$ beams were observed when graphite and tungsten liners used, as compared to tungsten liners used alone. See FIG. 9.

Having thus described several illustrative embodiments of the present disclosure, those of skill in the art will readily appreciate that yet other embodiments may be made and used within the scope of the claims hereto attached.

What is claimed is:

1. An ion implantation system for implanting one or more ionic species into a substrate, the system comprising:
   a gas source comprising an ionizable gas or gas mixture containing at least one ionizable gas; and
   an arc chamber comprising at least a first arc chamber material and a second arc chamber material, wherein the first and second arc chamber materials are different,
   wherein the arc chamber comprises arc chamber walls having interior-plasma facing surfaces and at least one of one or more arc chamber liners, a sputtering target disposed in the arc chamber, or a combination thereof, wherein the first and second arc chamber materials are present in the arc chamber walls, in the one or more arc chamber liners disposed in the arc chamber, a target disposed in the arc chamber, or a combination thereof.

2. The system of claim 1, wherein the arc chamber walls comprise the first arc chamber material, the first arc chamber material comprising tungsten, and wherein the second arc chamber material includes any one of boron, boron nitride, boron oxide, tungsten boride, or boron carbide.

3. The system of claim 2, wherein the second arc chamber material is coated onto or surface graded into, a portion of or all of the arc chamber walls.

4. The system of claim 1, including a first liner including the first arc chamber material and a second liner including a second arc chamber material, wherein the first arc chamber material is tungsten and the second arc chamber material is any one of one of boron, boron nitride, boron oxide, tungsten boride, or boron carbide.

5. The system of claim 1, wherein the gas source includes $BF_3$ gas and hydrogen.

6. The system of claim 1, wherein the gas source includes a first boron containing gas including $BF_3$, and a second boron containing gas including $B_2F_4$ gas or $B_2H_6$ gas.

7. The system of claim 6, wherein the gas source further comprises a diluent gas, wherein the diluent gas can be any one of hydrogen, krypton, neon, helium, argon, xenon, or a xenon/hydrogen gas mixture.

8. The system of claim 6, wherein the gas source further comprises one of hydrogen gas or a xenon/hydrogen gas mixture.

9. The system of claim 1, wherein the gas source includes one or more ionizable fluoride containing gases.

10. The system of claim 9, the arc chamber walls comprise tungsten and the second arc chamber material forms at least a portion of an arc chamber liner and includes graphite or a carbide containing compound.

11. The system of claim 1, comprising a target disposed in the arc chamber, the arc chamber comprising a first arc chamber material and the target comprising the second arc chamber material.

12. The system of claim 11, wherein the target reacts with or is sputtered by at least one of the ionizable gases or its ionic or neutral fragments.

13. The system of claim 1, wherein the gas source and/or at least the first or second arc chamber material comprises an isotopically enriched material.

14. The system of claim 13, wherein the gas source includes an ionizable gas including isotopically enriched boron or isotopically enriched germanium.

15. The system of claim 13, wherein at least one of the first or second arc chamber materials is an isotopically enriched material.

16. A method for implanting one or more ion species into a substrate using the ion implantation of claim 1, the method comprising:
selecting at least one of the first arc chamber material and the second arc chamber material based on the gas source;
flowing the gas source into the arc chamber at a predetermined flow rate;
generating ionic species from the gas source at a predetermined arc power and source magnet field, wherein the ionic species comprise a desired ionic species for substrate implantation;
operating the system to implant the one or more ion species into the substrate.
wherein the flow rate, arc power and source magnet field are chosen to provide a beam current for the desired ionic species that is increased to a greater extent than any of the other ionic species when the second arc chamber material is used, relative to the beam currents of the ionic species without the second arc chamber under the same optimal operating conditions.

17. The method of claim 16, wherein the gas source includes an ionizable boron containing gas, the arc chamber walls comprise the first arc chamber material, the first arc chamber material comprising tungsten, and wherein the second arc chamber material includes any one of boron, boron nitride, boron oxide, tungsten boride, or boron carbide.

18. The method of claim 16, further comprising disposing a removable target comprising the second arc chamber material in the arc chamber.

19. The method of claim 16, wherein the ionizable gas source is a ionizable fluoride containing gas source wherein fluoride ionic species are generated from the fluoride gases, the fluoride ionic species comprise a desired fluoride ionic species for substrate implantation; and wherein the flow rate, arc power and source magnet field are chosen to provide a beam current for the desired fluoride ionic species that is increased to a greater extent than any of the other fluoride ionic species when the second arc chamber liner is used, relative to the beam currents of the fluoride ionic species without the second arc chamber liner under the same optimal operating conditions.

20. The method of claim 16, wherein the first arc chamber material includes tungsten and the second arc chamber material includes graphite or a carbide containing compound.

* * * * *